United States Patent
Lim et al.

(10) Patent No.: US 7,791,376 B2
(45) Date of Patent: Sep. 7, 2010

(54) LOGIC CIRCUIT USING METAL-INSULATOR TRANSITION (MIT) DEVICE

(75) Inventors: JungWook Lim, Daejeon (KR); Sun-Jin Yun, Daejeon (KR); Hyun-Tak Kim, Daejeon (KR)

(73) Assignee: Electronics and Telecommunications Research Institute, Daejeon (KR)

(*) Notice: Subject to any disclaimer, the term of this patent is extended or adjusted under 35 U.S.C. 154(b) by 0 days.

(21) Appl. No.: 12/447,922

(22) PCT Filed: Aug. 7, 2007

(86) PCT No.: PCT/KR2007/003790

§ 371 (c)(1),
(2), (4) Date: Apr. 30, 2009

(87) PCT Pub. No.: WO2008/054055

PCT Pub. Date: May 8, 2008

(65) Prior Publication Data

US 2010/0066411 A1    Mar. 18, 2010

(30) Foreign Application Priority Data

Nov. 2, 2006  (KR) ............ 10-2006-0108034
Feb. 2, 2007  (KR) ............ 10-2007-0011121

(51) Int. Cl.
*H03K 19/20* (2006.01)

(52) U.S. Cl. ............ 326/104; 326/8; 326/136

(58) Field of Classification Search ............ None
See application file for complete search history.

(56) References Cited

U.S. PATENT DOCUMENTS

| 6,624,463 | B2  | 9/2003 | Kim et al. |
| 6,987,290 | B2* | 1/2006 | Kim et al. ............ 257/173 |
| 2006/0044036 | A1 | 3/2006 | Tatsumi et al. |
| 2008/0197916 | A1* | 8/2008 | Kim et al. ............ 327/551 |

FOREIGN PATENT DOCUMENTS

| KR | 2003-0024156 | 3/2003 |
| WO | WO-2005/041264 | 5/2005 |
| WO | WO-2005/041308 | 5/2005 |
| WO | WO-2006/088323 | 8/2006 |

OTHER PUBLICATIONS

Kim, Hyun-Tak et al., "Mechanism and observation of Mott transition in VO$_2$-based two- and three-terminal devices", New Journal of Physics, vol. 6 (2004) 52.

* cited by examiner

*Primary Examiner*—Anh Q Tran
(74) *Attorney, Agent, or Firm*—Rabin & Berdo, P.C.

(57) ABSTRACT

Provided is a logic circuit comprising a metal-insulator transition (MIT) device, including: an MIT device unit including an MIT thin film, an electrode thin film contacting the MIT thin film, and at least one MIT device undergoing a discontinuous MIT at a transition voltage $V_T$; a power source unit including at least one power source applying power to the MIT device; and at least one resistor connected to the MIT device, wherein a logic operation is performed on a signal through the power source to output the result of the logic operation as an output signal.

24 Claims, 7 Drawing Sheets

FIG. 2
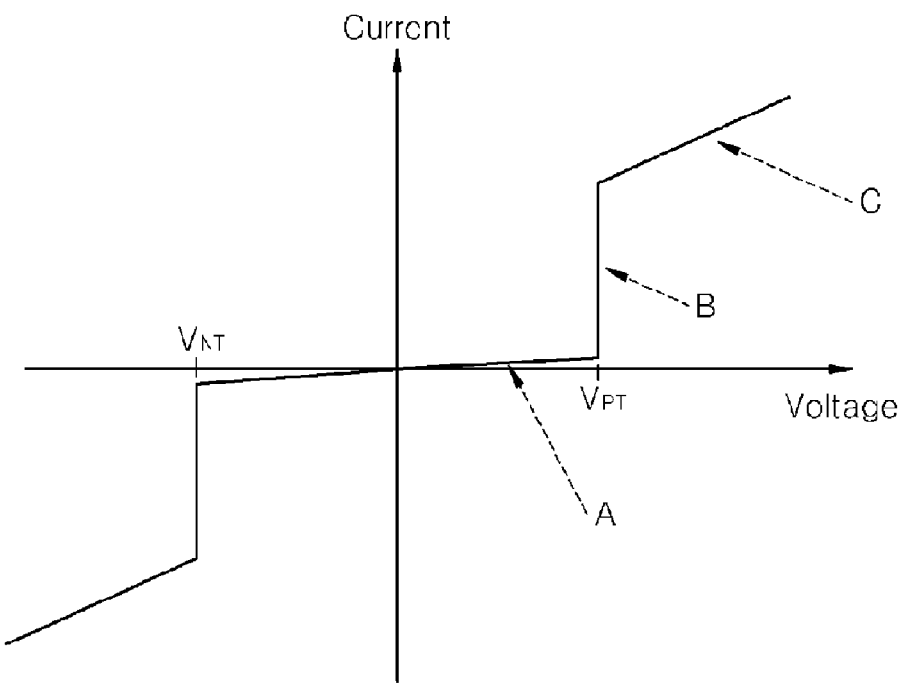
FIG. 3A
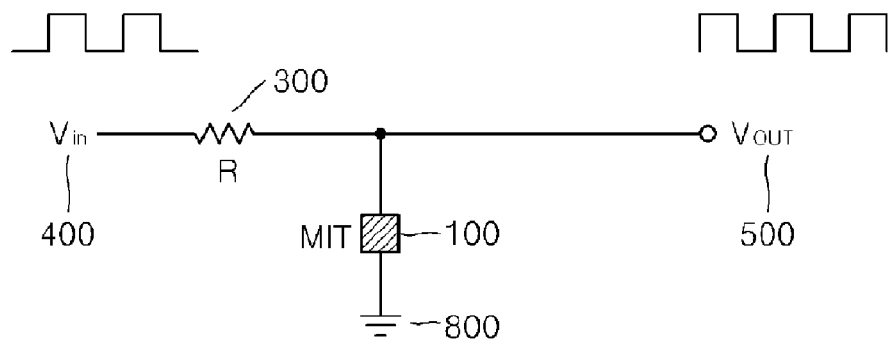
FIG. 3B
| INPUT | OUTPUT |
|-------|--------|
| ON    | OFF    |
| OFF   | ON     |

| V₁ | V₂ | V_OUT |
|---|---|---|
| OFF | OFF | OFF |
| ON | OFF | ON |
| OFF | ON | ON |
| ON | ON | ON |

| $V_1$ | $V_2$ | $V_{OUT}$ |
|---|---|---|
| OFF | OFF | OFF |
| ON | OFF | OFF |
| OFF | ON | OFF |
| ON | ON | ON |

FIG. 6A
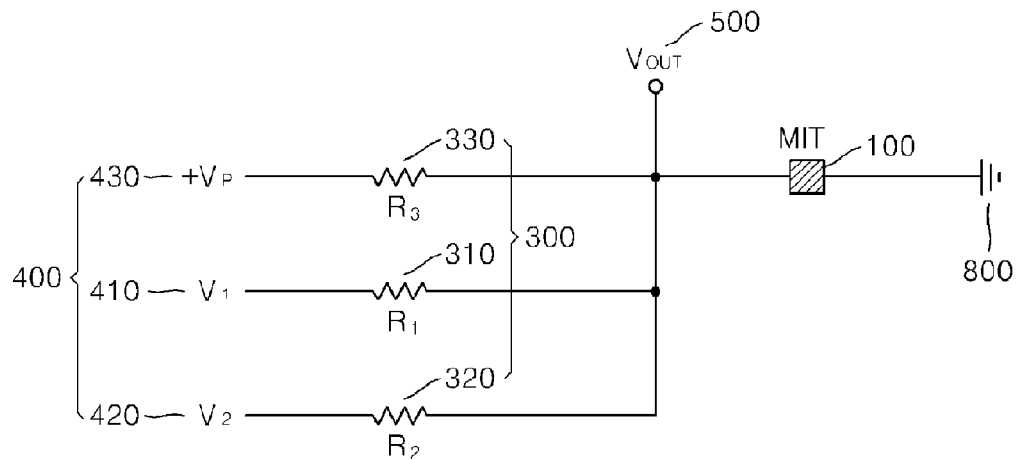
FIG. 6B
| V₁ | V₂ | V_OUT |
|---|---|---|
| OFF | OFF | ON |
| ON | OFF | OFF |
| OFF | ON | OFF |
| ON | ON | OFF |
FIG. 6C
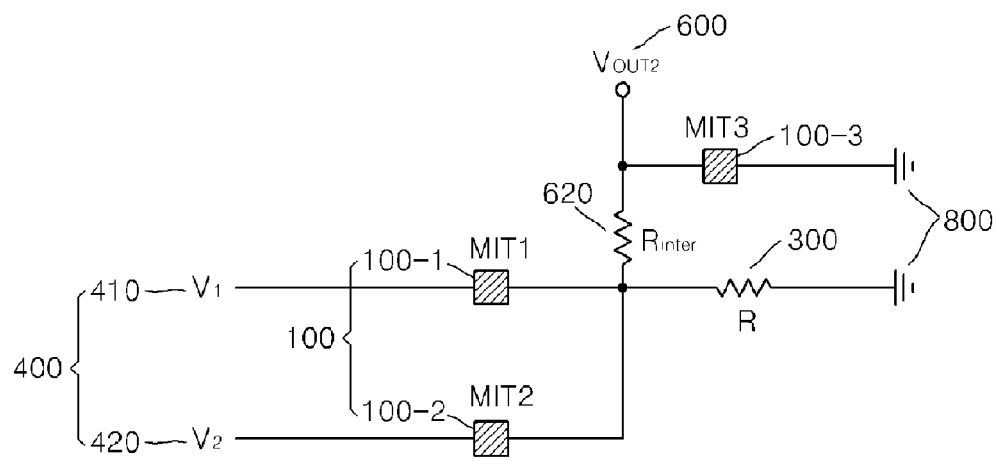

| V₁ | V₂ | V_OUT |
|---|---|---|
| OFF | OFF | ON |
| ON | OFF | ON |
| OFF | ON | ON |
| ON | ON | OFF |

LOGIC CIRCUIT USING METAL-INSULATOR TRANSITION (MIT) DEVICE

TECHNICAL FIELD

The present invention relates to a metal-insulator transition (MIT) device, and more particularly, to a logic circuit using an MIT device.

BACKGROUND ART

A discontinuous metal-insulator transition (MIT) from an insulator to a metal occurs without a crystal structure change when an electric field is applied to a $VO_2$ insulator with being changed. The discontinuous MIT phenomenon can be controlled. Details of the discontinuous MIT phenomenon are disclosed in the paper New J. Phys. 6 (2004) 52 (www.n-jp.org) by the inventors of the present application.

A discontinuous MIT is a first order transition (Mott transition) which causes an abrupt variation of a current with respect to an electric field. Besides the $VO_2$ insulator, several other insulators may show similar characteristics. The abrupt variation of the current with respect to the electric field may be utilized in various electronic devices.

Existing logic circuits generally include silicon semiconductor transistors, which have a complex structure including a semiconductor, an electrode, an insulator, etc. Also, several thin film processes must be performed to form such structure.

In the case of a silicon semiconductor transistor-based logic circuit, thin film processes have been integrated, and manufacturing cost has been increased. Thus, there is great demand for a simple structure which needs fewer process masks and provides a high current gain.

DISCLOSURE OF INVENTION

Technical Problem

The present invention provides a logic circuit capable of performing a logic operation using a metal-insulator transition (MIT) device generating a discontinuous transition from an insulator to a metal according to a variation of an electric field or a voltage.

Technical Solution

According to an aspect of the present invention, there is provided a logic circuit comprising an MIT device, including: an MIT device unit including an MIT thin film, an electrode thin film contacting the MIT thin film, and at least one MIT device undergoing a discontinuous MIT at a transition voltage $V_T$; a power source unit including at least one power source applying power to the MIT device; and at least one resistor connected to the MIT device, wherein a logic operation is performed on a signal through the power source to output the result of the logic operation as an output signal.

The MIT device may have a vertical structure in which the electrode thin film contacts upper and lower surfaces of the MIT device or a horizontal structure in which the electrode thin film contacts both sides of the MIT device. The MIT device unit may include the MIT device, and the power source unit may include the power source, the resistor may be connected in series with the MIT device, the power source may be connected to the resistor, a ground may be connected to the MIT device, and an output port may be connected between the resistor and the MIT device, so that the logic circuit performs a function of an inverter logic circuit to invert a signal applied to the power source and output the inverted signal to the output port.

An input ON signal applied to the power source may have a voltage greater than or equal to a threshold voltage at which the MIT device undergoes an MIT, and an input OFF signal applied to the power source may have a voltage less than the threshold voltage.

The MIT device unit may include two MIT devices connected in parallel, the power source unit may include two power sources respectively connected to the two MIT devices, the two MIT devices may be connected in series with the resistor connected to the ground, and an output port may be connected between the two MIT devices and the resistor, so that the logic circuit performs a function of an OR logic circuit to perform an OR operation on signals applied to the two power sources and output the result of the OR operation as an output signal to the output port. Input ON signals applied to the two power sources may have voltages greater than or equal to a threshold voltage, and input OFF signals applied to the two power sources may have voltages less than the threshold voltage. An output OFF signal may be output to the output port only when input OFF signals are applied to the two power sources.

An inverter MIT device connected to a ground may be connected between the two MIT devices and the resistor through a connection resistor, and a second output port may be connected between the connection resistor and the inverter MIT device, so that the logic circuit performs a function of a NOR logic circuit to perform a NOR operation on signals applied from the two power sources and output the result of the NOR operation as an output signal to the second output port.

The MIT device unit may include the two MIT devices connected in parallel, the power source unit may include two power sources respectively connected to the two MIT devices, the two MIT devices may be connected in series with the resistor connected to a fixed voltage $V_P$, and an output port may be connected between the two MIT devices and the resistor, so that the logic circuit performs a function of an AND logic circuit to perform an AND operation on signals applied to the two power sources and output the result of the AND operation as an output to the output port. Input ON signals applied to the two power sources may be greater than the fixed voltage $V_P$ and smaller than the difference between a transition voltage $V_T$ and the fixed voltage $V_P$, and input OFF signals applied may be smaller than the difference between the transition voltage $V_T$ the fixed voltage $V_P$.

If input ON signals are applied to the two power sources, the two MIT devices may remain operating as insulators, and thus an output ON signal approximately equal to the fixed voltage $V_P$ may be output to the output port, and if an input OFF signal is applied to at least one of the two power sources, the MIT device supplied with the input OFF signal may undergo an MIT, and thus an output OFF signal approximately equal to the input OFF signal may be output to the output port.

Input ON signals applied to the two power sources may be smaller than the difference between a transition voltage $V_T$ and the fixed voltage $V_P$ and smaller than the fixed voltage $V_P$, input OFF signals applied to the two power sources may be smaller than the difference between the transition voltage $V_T$ and the fixed voltage $V_P$ and smaller than the fixed voltage $V_P$, if input ON signals are applied to the power sources, the two MIT devices may remain operating insulators, and thus an output ON signal approximately equal to the fixed voltage $V_P$ is output to the output port, and if an input OFF signal is applied to at least one of the two power sources, the MIT device supplied with the input OFF signal may undergo an MIT, and thus an output OFF signal approximately equal to the input OFF signal may be output to the output port.

An inverter MIT device connected to a ground may be connected between the two MIT devices and the resistor through a connection resistor, and a second output port may be connected between the connection resistor and the inverter MIT device, so that the logic circuit performs a function of a NAND logic circuit to perform a NAND operation on signals applied to the two power sources and output the result of the NAND operation as an output signal to the second output port.

The power source unit may include first, second, and third power sources respectively connected to first, second, and third resistors connected in parallel, the MIT device unit may include an MIT device connected to a ground, input signals may be applied to the first and second power sources, a fixed voltage $V_P$ may be applied to the third power source, the third resistor may have a smaller resistance than the first and second resistors, the MIT device may be connected in series with the first, second, and third resistors, and an output port may be connected between the first, second, and third resistors and the MIT device, so that the logic circuit performs a function of a NOR logic circuit to perform a NOR operation on signals applied to the two power sources and output the result of the NOR operation as an output signal to the output port.

Input ON signals applied to the first and second power sources may have voltages greater than or equal to a threshold voltage at which the MIT device undergoes an MIT, input OFF signals applied to the first and second power sources may have voltages less than the threshold voltage, if input OFF signals are applied to the first and second power sources, an output ON signal approximately equal to the fixed voltage $V_P$ may be output to the output port, and if an input ON signal is applied to at least one of the first and second power sources, the MIT device may generate an MIT to output an output OFF signal approximately equal to a ground to the output port.

The power source unit may include two power sources respectively connected to two resistors connected in parallel, the MIT device unit may include an MIT device connected to the fixed voltage $V_P$, the MIT device may be connected to the two resistors, and an output port may be connected between the two resistors and the MIT device, so that the logic circuit performs a function of a NAND logic circuit to perform a NAND operation on signals applied to the two power source and output the result of the NAND operation as an output signal to the output port.

Input ON signals applied to the two power sources may be greater than the difference between a transition voltage $V_T$ and the fixed voltage $V_P$ and smaller than the fixed voltage $V_P$, and input OFF signals applied to the two power sources may be smaller than the difference between the transition voltage $V_T$ and the fixed voltage $V_P$.

If input ON signals are applied to the two power sources, the MIT device may remain operating as an insulator to output an output OFF signal approximately equal to a voltage of the input ON signals to the output port, and if an input OFF signal is applied to at least one of the two power sources, the MIT device may undergo an MIT to output an output ON signal approximately equal to the fixed voltage $V_P$ to the output port.

Input ON signals applied to the two power sources may be greater than the difference between a transition voltage $V_T$ and the fixed voltage $V_P$ and smaller than the fixed voltage $V_P$, input OFF signals applied to the two power sources may be greater than the sum of the transition voltage $V_T$ and the fixed voltage $V_P$, if input ON signals applied to the two power sources, the MIT device may remain operating as an insulator to output an output OFF signal approximately equal to the input ON signals to the output port, and if an input OFF signal is applied to at least one of the two power sources, the MIT device may undergo an MIT to output an output ON signal approximately equal to the fixed voltage $V_P$ to the output port.

Each of the inverter, OR, AND, NOR, and NAND logic circuits may include a capacitor, one of an inductor and a capacitor, and an inductor.

The logic circuit of the present invention can contribute to easy constitutions of various logic circuits using an MIT device and a resistor. The size and transition voltage of the MIT device can be freely controlled, and the MIT device can be manufactured using various materials at a low cost. Also, the MIT device can be manufactured by a much simpler method than a conventional silicon semiconductor transistor. As a result, the logic circuit of the present invention has advantages over a silicon semiconductor-based logic circuit in terms of structure, manufacturing cost and process.

Advantageous Effects

A logic circuit using an MIT device according to the present invention can enable various logic circuits to be easily constituted using an MIT device and a resistor.

The size and transition voltage of the MIT device can be freely adjusted. Also, the MIT device can be formed using various materials at low cost. In addition, the MIT device can be manufactured using a much simpler method than a conventional silicon semiconductor transistor. Thus, the logic circuit using the MIT device has advantages over a silicon semiconductor-based logic circuit in terms of structure, production cost, and manufacturing process.

DESCRIPTION OF DRAWINGS

The above and other features and advantages of the present invention will become more apparent by describing in detail exemplary embodiments thereof with reference to the attached drawings in which:

FIG. 2 is a graph of current with respect to voltage, illustrating the characteristics of a discontinuous MIT;

FIG. 3A is a circuit diagram of an inverter logic circuit using an MIT device according to an embodiment of the present invention;

FIG. 3B is a truth table of the inverter logic circuit of FIG. 3A;

FIG. 6A is a circuit diagram of a NOR logic circuit using an MIT device according to another embodiment of the present invention;

FIG. 6B is a truth table of the NOR logic circuit of FIG. 6A;

FIG. 6C is a circuit diagram of a NOR logic circuit according to another embodiment of the present invention;

BEST MODE

Figure 1A:
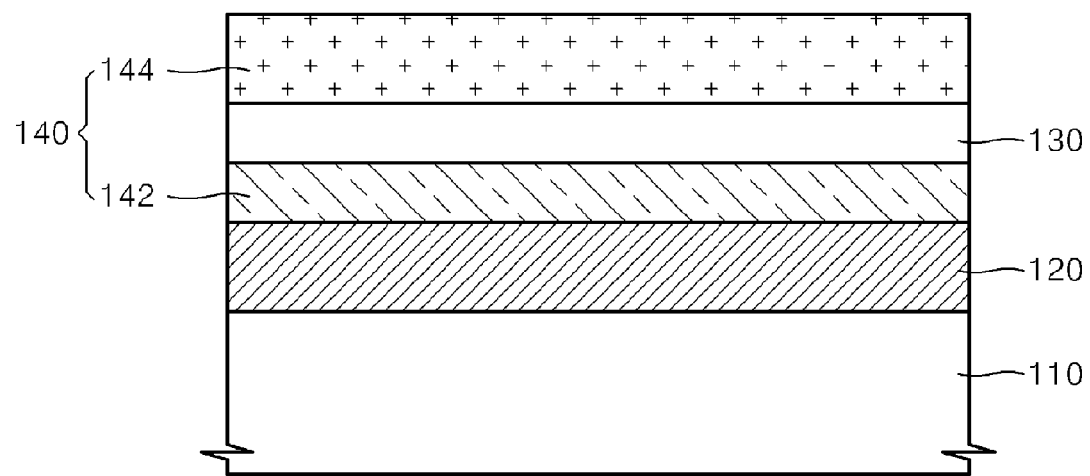
FIG. 1A is a cross-sectional view of a metal-insulator transition (MIT) device having a vertical structure.

The present invention will now be described more fully with reference to the accompanying drawings, in which exemplary embodiments of the invention are shown. The invention may, however, be embodied in many different forms, and should not be construed as being limited to the embodiments set forth herein; rather, these embodiments are provided so that this disclosure will be thorough and complete, and will fully convey the concept of the invention to those skilled in the art. It will also be understood that when a layer is referred to as being 'on' another layer or substrate, it can be directly on the other layer or substrate, or intervening layers may also be present. Like reference numerals denote like elements in the drawings, and thus their description will not be repeated.

A metal-insulator transition (MIT) device will now be described in brief. The MIT device includes a transition thin film and at least two electrode thin films. The MIT device may have a vertical (or stack) structure or a horizontal structure, according to the positions of the transition thin film and the electrode thin films.

FIG. 1A is a cross-sectional view of an MIT device having a vertical structure. Referring to FIG. 1A, the MIT device having the vertical structure includes a substrate 110, a buffer layer 120 formed on the substrate 110, and a first electrode thin film 142, a transition thin film 130, and a second electrode thin film 144 formed on the buffer layer 120.

The buffer layer 120 relieves a lattice mismatch between the substrate 110 and the first electrode thin film 142. If the lattice mismatch between the substrate 110 and the first electrode thin film 142 is very small, the first electrode thin film 142 may be formed directly on the substrate 110 without the buffer layer 120. The buffer layer 120 may be formed of $SiO_2$ or $Si_3N_4$.

The transition thin film 130 may include at least one of an inorganic compound semiconductor and an insulator including low density holes including oxide, carbon, a (III-V-group or II-VI-group) semiconductor element, a transition metal element, a rare-earth element, lanthanum-based elements, an organic semiconductor and an insulator including low density holes. The transition thin film 130 may at least one of an inorganic semiconductor, an inorganic insulator, an organic semiconductor and an organic insulator including low density holes. The transition thin film 130 may include at least one of oxide, carbon, lanthanum-based elements.

The transition thin film 130 may also include an n-type, high resistance semiconductor or an insulator. Here, the density of added holes is about $3 \times 10^{16}$ $\square^3$. The transition thin film 130 may be formed of an oxide including Ti, such as $Si_xTi_yO$, $Al_xTi_yO$, $Zn_xTi_yO$, $Zr_xTi_yO$, $Ta_xTi_yO$, $V_xTi_yO$, $La_xTi_yO$, $Ba_xTi_yO$, or $Sr_xTi_yO$, an oxide such as $Al_2O_3$, $VO_2$, $ZrO_2$, $ZnO$, $HfO_2$, $Ta_2O_5$, $NiO$, or $MgO$, a compound such as GaAs, GaSb, InP, InAs, or GST(GeSbTe), Si, Ge, or the like.

The transition thin film 130 may be deposited by sputtering deposition, molecular beam epitaxy (MBE), electronic beam (E-beam) evaporation, thermal evaporation, atomic layer epitaxy (ALE), pulsed laser deposition (PLD), chemical vapor deposition (CVD), Sol-Gel deposition, atomic layer deposition (ALD), or the like.

The electrode thin film 140 may be formed of a compound including at least one of Al, Cu, Ni, W, Mo, Cr, Zn, Mg, Fe, Co, Sn, Pb, Au, Ag, Pt, Ti, Ta, TaN, TaW, WN, TiN, TiW, poly-Si, IrO, RuO, ITO, and ZnO. The electrode thin film 140 may also be formed by sputtering deposition, vacuum deposition, E-beam deposition, or the like.

The substrate 110 may be formed of at least one of Si, $SiO_2$, GaAs, $Al_2O_3$, plastic, glass, $V_2O_5$, $PrBa_2Cu_3O_7$, $YBa_2Cu_3O_7$, MgO, $SrTiO_3$, $SrTiO_3$ doped with Nb, and a silicon on insulator (SOI).

The electrical characteristics of the MIT device vary abruptly with voltage. The MIT device shows insulator characteristics at voltages below a transition voltage but shows metal characteristics at voltages greater than or equal to the transition voltage. The transition voltage may be adjusted according to the materials and structure of the MIT device.

Figure 1B:
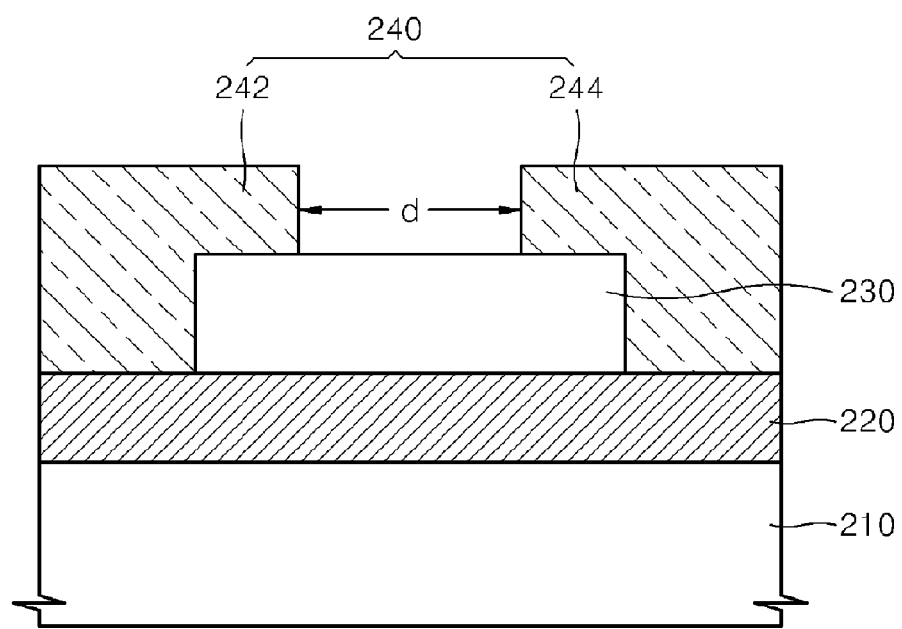
FIG. 1B is a cross-sectional view of an MIT device having a horizontal structure.

FIG. 1B is a cross-sectional view of an MIT device having a horizontal structure. Referring to FIG. 1B, the MIT device having the horizontal structure includes a substrate 210, a buffer layer 220 formed on the substrate 220, a transition thin film 230 formed on a portion of an upper surface of the buffer layer 220, and first and second electrode thin films 242 and 244 which are formed on a side and an upper surface of the transition thin film 230 to face each other above the buffer layer 220. In other words, the first and second electrode thin films 242 and 244 are spaced apart from each other on either side of the transition thin film 230.

The materials and functions of the MIT device having the horizontal structure are the same as those of the MIT device of FIG. 1A. The MIT device of FIG. 1B differs from the MIT device of FIG. 1A in that its transition voltage can be adjusted according to the horizontal distance d between the first and second electrode thin films 242 and 244.

FIG. 2 is a graph of current with respect to voltage, illustrating the characteristics of a discontinuous MIT.

Referring to FIG. 2, if a voltage is applied in positive direction (if a positive voltage is applied, the MIT device has insulator characteristics A at voltages below a positive transition voltage $V_{PT}$. Also, the MIT device shows a discontinuous current jump B at the positive transition voltage $V_{PT}$, and has metal characteristics C at voltages greater than or equal to the positive transition voltage $V_{PT}$. If a negative voltage is applied, the MIT device shows the same characteristics as for a positive voltage, showing insulator characteristics at voltages above a negative transition voltage $V_{NT}$, a discontinuous current jump at the negative transition voltage $V_{NT}$, and metal characteristics at voltages lower than or equal to the negative transition voltage $V_{NT}$.

The absolute values of the positive and negative transition voltages $V_{PT}$ and $V_{NT}$ must be the same if the kinds of metal electrodes are the same. However, the absolute values are substantially slightly different from each other. In the case of the MIT device having the horizontal structure, the difference between the absolute values of the positive and negative transition voltages $V_{PT}$ and $V_{NT}$ may be easily controlled. In the case of the MIT device having the vertical structure, the upper and lower electrodes may be different from each other. In this case, the kinds of metal electrodes may be changed to vary the absolute values of the positive and negative transition voltages $V_{PT}$ and $V_{NT}$ and control the difference between their absolute values.

In other words, in an MIT device, arrangements and materials for electrodes of a vertical or horizontal structure can be changed to vary the transition voltages. This allows an appropriate logic device structure which will be described later.

FIG. 3A is a circuit diagram of an inverter logic circuit using an MIT device according to an embodiment of the present invention, and FIG. 3B is a truth table of the inverter logic circuit of FIG. 3A. Referring to FIG. 3A, the inverter logic circuit according to the present embodiment includes an MIT device 100, a resistor 300, a power source 400, and an output port 500. Thus, the inverter logic circuit inverts a signal applied through the power source 400 and outputs the inverted signal to the output port 500. The inverter logic circuit has a structure in which the resistor 300 and the MIT device 100 are connected to each other in series, the power source 400 is connected to a port of the resistor 300, and a ground 800 is connected to a port of the MIT device 100. The output port 500 is connected between the resistor 300 and the MIT device 100 to output a voltage applied to the MIT device 500 as an output signal. Here, the resistor 300 may have an intermediate resistance which is smaller than the resistance of an insulation state of the MIT device 100 and greater than the resistance of a metal state of the MDT device 100.

An input signal is applied through the power source 400. An ON state of the input signal is a voltage higher than the threshold voltage at which the MIT device 100 undergoes an MIT, and an OFF state of the input signal is a voltage lower than the threshold voltage. The threshold voltage is higher than a transition voltage of the MIT device 100. Thus, the MIT device 100 only undergoes a discontinuous MIT if a voltage higher than the transition voltage is input in consideration of a voltage applied to the resistor 300.

The operation of the inverter logic circuit will be described with reference to the truth table of FIG. 3B. If the ON signal is input to the power source 400, the MIT device 100 makes a discontinuous MIT to a metal. Thus, the voltage applied to the MIT device is very low, approximately 0V, and the output signal at the output port 500 is in the OFF state. If the OFF signal is applied to the power source 400, the MIT device 100 operates as an insulator. Also, most of the voltage applied from the power source is applied to the MIT device 100, and thus the output signal at the output port is in the ON state. An input OFF signal must be higher than an output OFF signal. In other words, the input OFF signal must have a predetermined intensity less than the threshold voltage to be detected as an ON signal at an output port.

The inverter logic circuit according to the present embodiment can be easily constructed of an MIT and a resistor, and may further include a capacitor, an inductor or a capacitor and an inductor.

Figures 4A, 4B:
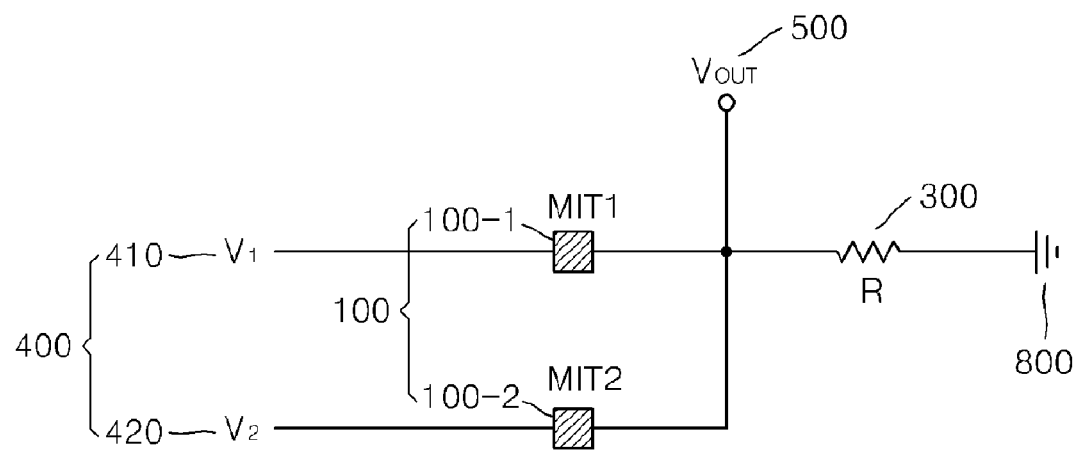
FIG. 4A is a circuit diagram of an OR logic circuit using an MIT device according to another embodiment of the present invention.
FIG. 4B is a truth table of the OR logic circuit of FIG. 4A.

FIG. 4A is a circuit diagram of an OR logic circuit using an MIT device according to another embodiment of the present invention, and FIG. 4B is a truth table of the OR logic circuit of FIG. 4A. Referring to FIG. 4A, the OR logic circuit according to the present embodiment includes an MIT device unit 100, a resistor 300, a power source unit 400, and an output port 500. The OR logic circuit performs an OR operation on two signals applied through the power source 400, and outputs the OR result to the output port 500. The OR logic circuit has a structure in which first and second MIT devices 100-1 and 100-2 of the MIT device unit 100 are connected in parallel with each other, and in series with the resistor 300, and first and second power sources 410 and 420 of the power source unit 400 are respectively connected to the first and second MIT devices 100-1 and 100-2. A ground 800 is connected to a port of the resistor 300, and the output port 500 is connected between the MIT device unit 100 and the resistor 300 to output a voltage applied to the resistor 300 as an output signal.

Input signals are respectively applied to the first and second power sources 410 and 420 of the power source unit 400. ON states of the input signals are greater than or equal to a threshold voltage at which the first and second MIT devices 100-1 and 100-2 undergo MITs, and OFF states of the input signals are less than the threshold voltage. As described with reference to FIG. 3A, the threshold voltage must be higher than the transition voltages of the first and second MIT devices 100-1 and 100-2. The transition voltages of the first and second MIT devices 100-1 and 100-2 may satisfy '$V_{PT}<|V_{NT}|$.' This is because the first MIT device 100-1 connected to the first power source 410 may undergo a discontinuous MIT if the signal of the first power source 410 is off and the signal of the second power source 420 is on. This condition is necessary for the stable operation of the OR logic circuit. However, the results of the truth table of the OR logic circuit do not vary.

The operation of the OR logic circuit will now be described with reference to the truth table of FIG. 4B. If an ON signal is input to one of the first and second power sources 410 and 420, the MIT device supplied with the ON signal undergoes a discontinuous MIT. Thus, that device operates as a metal, and almost all the voltage of the input ON signal is applied to the resistor 300. As a result, the output signal at the output port 500 is in an ON state.

If OFF signals are input to the first and second power sources 410 and 420, the first and second MIT devices 100-1 and 100-2 operate as insulators, and a voltage is applied to the resistor 300 according to voltage distribution rules. As a result, the output signal at the output port 500 is in an OFF state.

The OR logic circuit of the present embodiment can be realized using two MIT devices and a resistor. The OR logic circuit may further include a capacitor, an inductor or a capacitor, and an inductor.

The inverter logic circuit may be connected as an output port of the OR logic circuit to perform an NOR operation on two input signals so as to realize a NOR logic circuit. In other words, the signal of the output port 500 of the OR logic circuit may be input as an input signal of the inverter logic circuit of FIG. 3A to realize a circuit having the same truth table as the NOR logic circuit. This will be described in more detail later with reference to FIG. 6C.

Figures 5A, 5B:
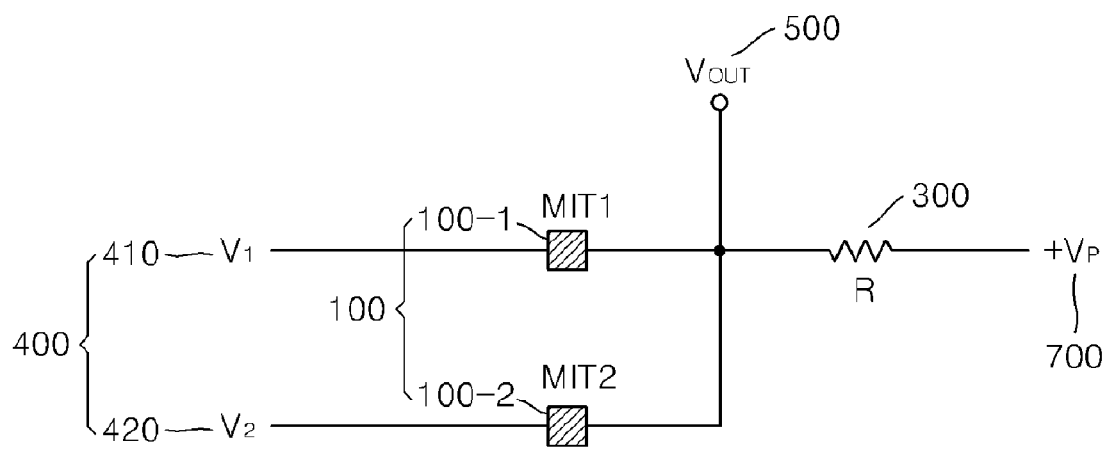
FIG. 5A is a circuit diagram of an AND logic circuit using an MIT device according to another embodiment of the present invention.
FIG. 5B is a truth table of the AND logic circuit of FIG. 5A.

FIG. 5A is a circuit diagram of an AND logic circuit using an MIT device according to another embodiment of the present invention, and FIG. 5B is a truth table of the AND logic circuit of FIG. 5A. Referring to FIG. 5A, the AND logic circuit according to the present embodiment includes an MIT device unit 100, a resistor 300, a power source unit 400, and an output port 500. The AND logic circuit performs an AND operation on two signals applied through the power source unit 400 and outputs the AND operation result to the output port 500. The AND logic circuit has a structure in which first and second MIT devices 100-1 and 100-2 of the MIT device unit 100 are connected in parallel with each other, and in series with the resistor 300, and first and second power sources 410 and 420 of the power source unit 400 are respectively connected to the first and second MIT devices 100-1 and 100-2. A fixed voltage source 700 is connected to a port of the resistor 300, and the output port 500 is connected between the MIT device unit 100 and the resistor 300 to output a voltage applied to the resistor 300 as an output signal.

The voltages of ON and OFF signals input to the first and second power sources 410 and 420 and the voltages of ON and OFF signals output from the output port 500 must be carefully defined. Two methods of defining the voltages of input and output signals will now be described.

In the first method, a voltage greater than a fixed voltage $V_P$ and smaller than the sum of a transition voltage $V_T$ and the fixed voltage $V_P$ is defined as an input ON signal. A voltage smaller than the difference between the transition voltage $V_T$ and the fixed voltage $V_P$ is defined as an input OFF signal.

At the output port 500, a voltage approximately equal to the fixed voltage $V_P$ is defined as an output ON signal, and a voltage approximately equal to the input OFF signal is defined as an output OFF signal.

The operation of the AND logic circuit will be described with reference to the truth table of FIG. 5b, based on the definitions of the input and output signals. If the first and second power sources 410 and 420 apply ON signals, the first and second MIT devices 100-1 and 100-2 may operate as insulators. Also, a voltage approximately equal to the fixed voltage $V_P$ is output to the output port 500 according to the voltage distribution rules. In other words, an output ON signal is output.

If at least one of the first and second power sources 410 and 420 applies an OFF signal, the corresponding MIT device may undergo a discontinuous MIT to operate as a metal, and a voltage approximately equal to the input OFF signal may be output. In other words, an output OFF signal may be output.

The input and output signals may be defined using the follow method. In the case of the input signal, a voltage greater than the difference between the transition voltage $V_T$ and the fixed voltage $V_P$ and smaller than the fixed voltage $V_P$ is defined as an input ON signal. A voltage smaller than the difference between the transition voltage $V_T$ and the fixed voltage $V_P$ is defined as an input OFF signal. In the case of the output signal, a voltage approximately equal to the fixed voltage $V_P$ is defined as an output ON signal, and a voltage approximately equal to the input OFF signal is defined as an output OFF signal.

The truth table of the AND logic circuit shown in FIG. 5B may be obtained through the definitions of the input and output signals.

The AND logic circuit of the present embodiment can be realized using two MIT devices and a resistor. The AND logic circuit may further include a capacitor, an inductor or a capacitor and an inductor. Also, the AND logic circuit may be constituted based on a different definition method from the above-described methods of defining the input and output signals.

The inverter logic circuit of FIG. 3A may be connected at the output port to form a NAND logic circuit. In other words, the signal of the output port 500 of the AND logic circuit may be input to the inverter logic circuit of FIG. 3A to realize a circuit having the same truth table as a NAND logic circuit.

FIG. 6A is a circuit diagram of a NOR logic circuit using an MIT device according to another embodiment of the present invention, and FIG. 6B is a truth table of the NOR logic circuit of FIG. 6A. Referring to FIG. 6A, the NOR logic circuit according to the present embodiment includes an MIT device 100, a resistor unit 300, a power source unit 400, and an output port 500. The NOR logic circuit performs a NOR operation on two signals applied through the power source unit 400 and outputs the result to the output port 500.

The NOR logic circuit has a structure in which first, second, and third resistors 310, 320, and 330 of the resistor unit 300 are connected in parallel with each other, and in series with the MIT device 100, and first, second, and third power sources 410, 420, and 430 of the power source unit 400 are connected respectively to the first, second, and third resistors 310, 320, and 330. The first and second power sources 410 and 420 apply input signals, and the third power source 430 applies a fixed voltage $V_P$. A ground 800 is connected to a port of the MIT device 100, and the output port 500 is connected between the resistor unit 300 and the MIT device 100 to output a voltage applied to the MIT device 100 as an output signal. Here, the third resistor 330 may have a much lower resistance than the first and second resistors 310 and 320. This is to output a voltage approximately equal to the fixed voltage $V_P$ when the MIT device 100 does not undergo a discontinuous MIT.

In the case of the NOR logic circuit of the present embodiment, input and output signals are defined using the following method.

In the case of an input signal, a voltage greater than or equal to a threshold voltage at which an MIT device undergoes an MIT is defined as an input ON signal. A voltage less than the threshold voltage is defined as an input OFF signal. In the case of an output signal, a voltage approximately equal to the fixed voltage $V_P$ is defined as an output ON signal, and a voltage approximately equal to a ground is defined as an output OFF signal.

The operation of the NOR logic circuit will now be described with reference to the truth table of FIG. 5B based on the definition method of the input and output signals. If an ON signal is input to at least one of the first and second power sources 410 and 420, the MIT device 100 may undergo an abrupt MIT to operate as a metal. Thus, the signal at the output port 500 may be approximately equal to a ground, i.e. an output OFF signal.

If OFF signals are applied to the first and second power sources 410 and 420, the MIT device 100 may operate as an insulator. Thus, a voltage approximately equal to the fixed voltage $V_P$, i.e. an output ON signal, may be output to the output port 500.

FIG. 6C is a circuit diagram of a NOR logic circuit according to the embodiment of the present invention described with reference to FIG. 4A.

Referring to FIG. 6C, in the NOR logic circuit of the present embodiment, the inverter circuit of FIG. 3A is connected to the output port 500 of FIG. 4A. Here, a connection resistor 620 performs the function of the resistor 300 of FIG. 3A, a third MIT device 100-3 performs the function of the MIT device 100 of FIG. 3A, and an output port 600 functions as an output port of the NOR logic circuit. The output signal of FIG. 4B is the input signal of the inverter logic circuit, and an output signal at the output port 600 is equal to the output signal of FIG. 6B.

The NOR logic circuit of FIG. 6A can be realized using an MIT device and three resistors. Since one MIT device is required, the NOR logic circuit of FIG. 6A can be more highly integrated than the NOR logic circuit of FIG. 6C. The NOR logic circuit of the present embodiment may further include a capacitor, an inductor or a capacitor and an inductor. Also, the NOR logic circuit may be constituted using a different input and output signal definition method from the previously described input and output signal definition method.

Figures 7A, 7B:
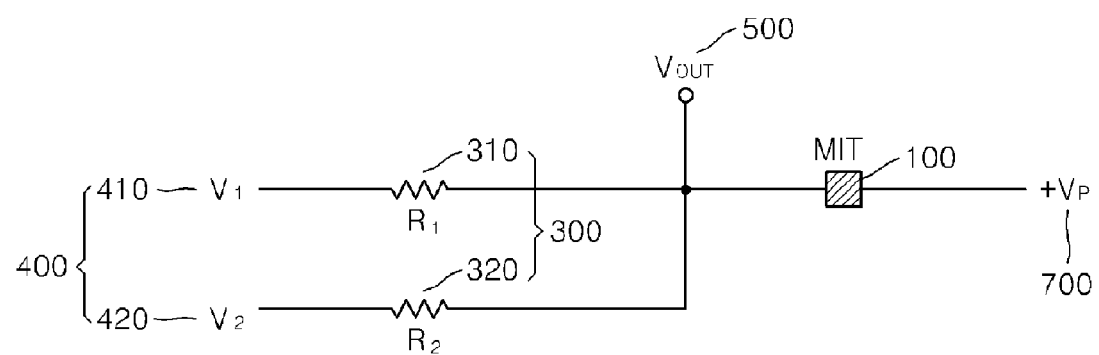
FIG. 7A is a circuit diagram of a NAND logic circuit using an MIT device according to another embodiment of the present invention.
FIG. 7B is a truth table of the NAND logic circuit of FIG. 7A.

FIG. 7A is a circuit diagram of a NAND logic circuit using an MIT device according to another embodiment of the present invention, and FIG. 7B is a truth table of the NAND logic circuit of FIG. 7A. Referring to FIG. 7A, the NAND logic circuit of the present embodiment includes an MIT device 100, a resistor unit 300, a power source unit 400, and an output port 500. The NAND logic circuit performs a NAND operation on two signals applied through the power source unit 400 to output the result to the output port 500. The NAND logic circuit has a structure in which first and second resistors 310 and 320 of the resistor unit 300 are connected in parallel with each other, and in series with the MIT device 100, and first and second power sources 410 and 420 of the power source 400 are connected respectively to the first and second resistors 310 and 320, respectively. A fixed voltage source 700 applying a fixed voltage $V_P$ is connected to a port of the MIT device 100, and the output port 500 is connected between the MIT device 100 and the resistor unit 300 to output the voltage applied to the MIT device 100 and the resistor unit 300 as an output signal.

The voltages of input ON and OFF signals respectively input to the first and second power sources 410 and 420 and the voltages of output ON and OFF signals output to the output port 500 must be carefully defined. Two methods of defining the voltages of input and output signals will now be described.

In the case of input signals according to the first method, a voltage greater than the difference between a transition voltage $V_T$ and a fixed voltage $V_P$ and smaller than the fixed voltage $V_P$ is defined as an input ON signal. A voltage smaller than the difference between the transition voltage $V_T$ and the fixed voltage $V_P$ is defined as an input OFF signal. In the case of output signals, a voltage approximately equal to the input ON signal is defined as an output OFF signal, and a voltage approximately equal to the fixed voltage $V_P$ is defined as an output ON signal.

The operation of the NAND logic circuit will now be described with reference to the truth table of FIG. 7B based on the input and output signal definition methods. If the first and second power sources 410 and 420 apply ON signals, the MIT device 100 may operate as an insulator, and a voltage approximately equal to the input ON signals may be output to the output port 500 according to the voltage distribution rules. In other words, an output OFF signal may be output.

If an OFF signal is applied to at least one of the first and second power sources 410 and 420, the MIT device 100 may undergo a discontinuous MIT to operate as a metal, and a voltage approximately equal to the fixed voltage $V_P$ may be output to the output port 500. In other words, an output ON signal may be output.

Input and output signals may also be defined using the following method. In the case of input signals, a voltage greater than the difference between the transition voltage $V_T$ and the fixed voltage $V_P$ and smaller than the fixed voltage $V_P$ is defined as an input ON signal. A voltage greater than the sum of the transition voltage $V_T$ and the fixed voltage $V_P$ is defined as an input OFF signal. In the case of output signals, a voltage approximately equal to the fixed voltage $V_P$ is defined as an output ON signal, and a voltage approximately equal to the input ON signal is defined as an output OFF signal.

The NAND logic circuit can obtain the same truth table as that of FIG. 7B through the input and output definition method.

Figure 7C:
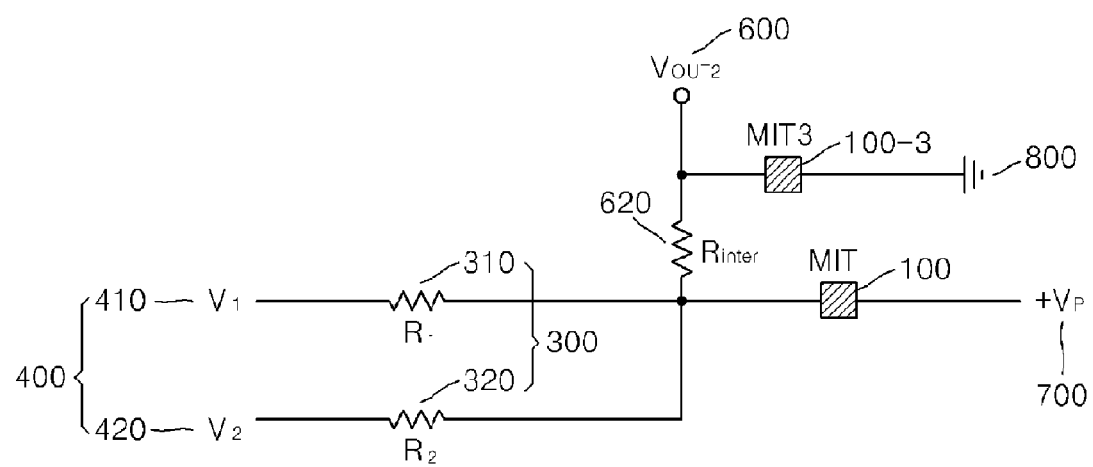
FIG. 7C is a circuit diagram of a NAND logic circuit according to another embodiment of the present invention.

FIG. 7C is a circuit diagram of a NAND logic circuit according to the embodiment of the present invention described with reference to FIG. 5A. Referring to FIG. 7C, in the NAND logic circuit of the present embodiment, the inverter logic circuit of FIG. 3A is connected to the output port 500 of FIG. 5A. Here, a connection resistor 620 performs the function of the resistor 300 of FIG. 3A, a third MIT device 100-3 performs the function of the MIT device 100 of FIG. 3A, and an output port 600 is an output port of the NAND logic circuit. The output signal of FIG. 5B is the input signal of the inverter logic circuit, and an output signal at the output port 600 is equal to the output signal of FIG. 7B.

In the NAND logic circuit of FIG. 7A, an OR logic circuit can be realized using an MIT device and two resistors. Here, since one MIT device is required, the NAND logic circuit can be highly integrated. Each of the NAND logic circuits of FIGS. 7A and 7C may further include a capacitor, an inductor or a capacitor, and an inductor. Also, the NAND logic circuits of FIGS. 7A and 7C can be realized using different input and output signal definition methods from the previously-described input and output signal definition methods.

Several types of logic circuits using MIT devices have been described. However, the present invention is not limited to these, and may be applied to different types of logic circuits using MIT devices.

While the present invention has been particularly shown and described with reference to exemplary embodiments thereof, it will be understood by those of ordinary skill in the art that various changes in form and detail may be made therein without departing from the spirit and scope of the present invention as defined by the following claims.

INDUSTRIAL APPLICABILITY

The present invention relates to a metal-insulator transition (MIT) device, and more particularly, to a logic circuit using an MIT device. The logic circuit using an MIT device according to the present invention can enable various logic circuits to be easily constituted using an MIT device and a resistor.

The invention claimed is:

1. A logic circuit comprising an MIT (metal-insulator transition) device, comprising:
   an MIT device unit comprising an MIT thin film, an electrode thin film contacting the MIT thin film, and at least one MIT device undergoing a discontinuous MIT at a transition voltage $V_T$;
   a power source unit comprising at least one power source applying power to the MIT device; and
   at least one resistor connected to the MIT device,
   wherein the logic circuit performs a function to output a logic operation for a signal applied to the power source.

2. The logic circuit of claim 1, wherein the MIT device has one of a vertical structure in which the electrode thin film contacts upper and lower surfaces of the MIT device and a horizontal structure in which the electrode thin film contacts both sides of the MIT device.

3. The logic circuit of claim 1, wherein the MIT device unit comprises the MIT device, and the power source unit comprises the power source, the resistor is connected in series with the MIT device, the power source is connected to the resistor, a ground is connected to the MIT device, and an output port is connected between the resistor and the MIT device, so that the logic circuit performs a function of an inverter logic circuit to invert a signal applied to the power source and output the inverted signal to the output port.

4. The logic circuit of claim 3, wherein an input ON signal applied to the power source has a voltage greater than or equal to a threshold voltage at which the MIT device can undergo an MIT, and an input OFF signal applied to the power source has a voltage less than the threshold voltage.

5. The logic circuit of claim 3, wherein the logic circuit comprises at least one of an inductor and a capacitor, and an inductor.

6. The logic circuit of claim 1, wherein the MIT device unit comprises two MIT devices connected in parallel, the power source unit comprises two power sources respectively connected to the two MIT devices, the two MIT devices are connected in series with the resistor connected to the ground, and an output port is connected between the two MIT devices and the resistor, so that the logic circuit performs a function of an OR logic circuit to perform an OR operation on signals applied to the two power sources and output the result of the OR operation as an output signal to the output port.

7. The logic circuit of claim 6, wherein input ON signals applied to the two power sources have voltages greater than or equal to a threshold voltage, and input OFF signals applied to the two power sources have voltages less than the threshold voltage.

8. The logic circuit of claim 6, wherein an output OFF signal is output to the output port only when input OFF signals are applied to the two power sources.

9. The logic circuit of claim 6, wherein an inverter MIT device connected to a ground is connected between the two MIT devices and the resistor through a connection resistor, and a second output port is connected between the connection resistor and the inverter MIT device, so that the logic circuit performs a function of a NOR logic circuit to perform a NOR operation on signals applied from the two power sources and output the result of the NOR operation as an output signal to the second output port.

10. The logic circuit of claim 6, wherein the logic circuit comprises, at least one of an inductor and a capacitor.

11. The logic circuit of claim 1, wherein the MIT device unit comprises the two MIT devices connected in parallel, the power source unit comprises two power sources respectively connected to the two MIT devices, the two MIT devices are connected in series with the resistor connected to a fixed voltage $V_P$, and an output port is connected between the two MIT devices and the resistor, so that the logic circuit performs a function of an AND logic circuit to perform an AND operation on signals applied to the two power sources and output the result of the AND operation as an output to the output port.

12. The logic circuit of claim 11, wherein input ON signals applied to the two power sources are greater than the fixed voltage $V_P$ and smaller than the sum of a transition voltage $V_T$ and the fixed voltage $V_P$, and input OFF signals applied are smaller than the difference between the transition voltage $V_T$ and the fixed voltage $V_P$.

13. The logic circuit of claim 12, wherein:
if input ON signals are applied to the two power sources, the two MIT devices remain operating as insulators, and thus an output ON signal approximately equal to the fixed voltage $V_P$ is output to the output port; and
if an input OFF signal is applied to at least one of the two power sources, the MIT device supplied with the input OFF signal undergoes an MIT, and thus an output OFF signal approximately equal to the input OFF signal is output to the output port.

14. The logic circuit of claim 11, wherein:
input ON signals applied to the two power sources are greater than the difference between a transition voltage $V_T$ and the fixed voltage $V_P$ and smaller than the fixed voltage $V_P$;
input OFF signals applied to the two power sources are greater than the difference between the transition voltage $V_T$ and the fixed voltage $V_P$;
if input ON signals are applied to the power sources, the two MIT devices remain operating insulators, and thus an output ON signal approximately equal to the fixed voltage $V_P$ is output to the output port; and
if an input OFF signal is applied to at least one of the two power sources, the MIT device supplied with the input OFF signal undergoes an MIT, and thus an output OFF signal approximately equal to the input OFF signal is output to the output port.

15. The logic circuit of claim 11, wherein an inverter MIT device connected to a ground is connected between the two MIT devices and the resistor through a connection resistor, and a second output port is connected between the connection resistor and the inverter MIT device, so that the logic circuit performs a function of a NAND logic circuit to perform a NAND operation on signals applied to the two power sources and output the result of the NAND operation as an output signal to the second output port.

16. The logic circuit of claim 11, wherein the logic circuit comprises, at least one of an inductor and a capacitor.

17. The logic circuit of claim 1, wherein the power source unit comprises first, second, and third power sources respectively connected to first, second, and third resistors connected in parallel, the MIT device unit comprises an MIT device connected to a ground, input signals are applied to the first and second power sources, a fixed voltage $V_P$ is applied to the third power source, the third resistor has a lower resistance than the first and second resistors, the MIT device is connected in series with the first, second, and third resistors, and an output port is connected between the first, second, and third resistors and the MIT device, so that the logic circuit performs a function of a NOR logic circuit to perform a NOR operation on signals applied to the two power sources and output the result of the NOR operation as an output signal to the output port.

18. The logic circuit of claim 17, wherein:
input ON signals applied to the first and second power sources have voltages greater than or equal to a threshold voltage at which the MIT device undergoes an MIT, and input OFF signals applied to the first and second power sources have voltages less than the threshold voltage; and
if input OFF signals are applied to the first and second power sources, an output ON signal approximately equal to the fixed voltage $V_P$ is output to the output port, and if an input ON signal is applied to at least one of the first and second power sources, the MIT device generates an MIT to output an output OFF signal approximately equal to a ground to the output port.

19. The logic circuit of claim 17, wherein the logic circuit comprises, at least one of an inductor and a capacitor.

20. The logic circuit of claim 1, wherein the power source unit comprises two power sources respectively connected two resistors connected in parallel, the MIT device unit comprises an MIT device connected to the fixed voltage $V_P$, the MIT device is connected to the two resistors, and an output port is connected between the two resistors and the MIT device, so that the logic circuit performs a function of a NAND logic circuit to perform a NAND operation on signals applied to the two power source and output the result of the NAND operation as an output signal to the output port.

21. The logic circuit of claim 20, wherein input ON signals applied to the two power sources are greater than the difference between a transition voltage $V_T$ and the fixed voltage $V_P$ and smaller than the fixed voltage $V_P$, and input OFF signals applied to the two power sources are smaller than the difference between the transition voltage $V_T$ and the fixed voltage $V_P$.

22. The logic circuit of claim 21, wherein if input ON signals are applied to the two power sources, the MIT device remains operating as an insulator to output an output OFF signal approximately equal to a voltage of the input ON signals to the output port, and if an input OFF signal is applied to at least one of the two power sources, the MIT device undergoes an MIT to output an output ON signal approximately equal to the fixed voltage $V_P$ to the output port.

23. The logic circuit of claim 20, wherein:
input ON signals applied to the two power sources are greater than the difference between a transition voltage $V_T$ and the fixed voltage $V_P$ and smaller than the fixed voltage $V_P$;

input OFF signals applied to the two power sources are greater than the sum of the transition voltage $V_T$ and the fixed voltage $V_P$;

if input ON signals applied to the two power sources, the MIT device remains operating as an insulator to output an output OFF signal approximately equal to the input ON signals to the output port; and if an input OFF signal is applied to at least one of the two power sources, the MIT device undergoes an MIT to output an output ON signal approximately equal the fixed voltage $V_P$ to the output port.

24. The logic circuit of claim 20, wherein the logic circuit comprises, at least one of an inductor and a capacitor.

* * * * *